(12) United States Patent
Kho et al.

(10) Patent No.: US 12,270,850 B2
(45) Date of Patent: Apr. 8, 2025

(54) SEMICONDUCTOR DEVICE TESTING WITH LEAD EXTENDER

(71) Applicant: Infineon Technologies AG, Neubiberg (DE)

(72) Inventors: Soon Lai Kho, Malacca (MY); Nee Wan Khoo, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 131 days.

(21) Appl. No.: 18/119,076

(22) Filed: Mar. 8, 2023

(65) Prior Publication Data

US 2024/0302426 A1    Sep. 12, 2024

(51) Int. Cl.
  *G01R 31/26*  (2020.01)
(52) U.S. Cl.
  CPC ................ *G01R 31/2601* (2013.01)
(58) Field of Classification Search
  USPC ........................................ 324/754.03; 439/62
  See application file for complete search history.

(56) References Cited

U.S. PATENT DOCUMENTS

| | | | |
|---|---|---|---|
| 5,336,094 A | | 8/1994 | Johnson |
| 5,594,355 A | | 1/1997 | Ludwig |
| 5,666,064 A | * | 9/1997 | Kasai ........................ G01R 1/04 439/70 |
| 5,990,692 A | * | 11/1999 | Jeong ...................... H01L 24/97 324/754.08 |
| 2011/0050269 A1 | * | 3/2011 | Miyazono ................ H01L 22/20 324/762.01 |
| 2014/0091443 A1 | * | 4/2014 | Duca ........................ H01L 21/56 257/667 |
| 2015/0070038 A1 | * | 3/2015 | Joo ..................... G01R 1/07371 324/754.07 |
| 2021/0384111 A1 | | 12/2021 | Voss et al. |
| 2022/0375830 A1 | | 11/2022 | Fuergut et al. |

FOREIGN PATENT DOCUMENTS

| | | |
|---|---|---|
| DE | 19838407 A1 | 3/2000 |
| KR | 102265359 B1 | 6/2021 |
| SG | 185157 A1 | 11/2012 |

* cited by examiner

*Primary Examiner* — Vincent Q Nguyen
(74) *Attorney, Agent, or Firm* — Murphy, Bilak & Homiller, PLLC

(57) ABSTRACT

A method includes providing a semiconductor package including an encapsulant body and a plurality of leads that protrude out from the encapsulant body; providing a semiconductor device testing apparatus including a package holder, a plurality of contact test probes, and a lead extender; arranging the semiconductor package within the package holder; actuating the semiconductor device testing apparatus such that a first one of the contact test probes directly contacts a first one of the leads and such that a second one of the contact test probes directly contacts the lead extender; and applying a test current to the semiconductor package such that part of the test current flows through the first one of the contact test probes directly contacting the first one of the leads and such that part of the test current flows through the second one of the contact test probes directly contacting the lead extender.

20 Claims, 8 Drawing Sheets

SEMICONDUCTOR DEVICE TESTING WITH LEAD EXTENDER

BACKGROUND

Many applications such as automotive and industrial applications use semiconductor packages that include power devices such as IGBTs (insulated gate bipolar transistors), power MOSFETs (metal oxide semiconductor field effect transistors), diodes, etc. These devices may be used in power converter circuits such as single and multi-phase half-wave rectifiers, single and multi-phase full-wave rectifiers, voltage regulators, etc. These semiconductor packages are qualified using testing equipment that verifies the functionality and performance of the device. Due to advances in semiconductor die current capacity and the interconnect technology used in power semiconductor packages, it may be challenging for testing equipment to apply the high magnitude testing currents needed to verify these packages. If the current density between the contact points of the testing equipment and the package is too high, the contact probe and/or the package lead may be damaged from burn out. Thus, there is a need for increasing the maximum electrical current that semiconductor device testing equipment can apply without damage to the equipment and/or device.

SUMMARY

A method of testing a semiconductor device is disclosed. According to an embodiment, the method comprises providing a semiconductor package comprising an encapsulant body and a plurality of leads that protrude out from the encapsulant body, providing a semiconductor device testing apparatus comprising a package holder, a plurality of contact test probes, and a lead extender, arranging the semiconductor package within the package holder, actuating the semiconductor device testing apparatus such that a first one of the contact test probes directly contacts a first one of the leads and such that a second one of the contact test probes directly contacts the lead extender, and applying a test current to the semiconductor package such that part of the test current flows through the first one of the contact test probes directly contacting the first one of the leads and such that part of the test current flows through the second one of the contact test probes directly contacting the lead extender.

A semiconductor device testing apparatus is disclosed. According to an embodiment, the semiconductor device testing apparatus comprises a package holder, a plurality of contact test probes, and a lead extender, wherein the semiconductor device testing apparatus is configured to actuate with a semiconductor package arranged within the package holder such that a first one of the contact test probes directly contacts a first one of the leads and such that a second one of the contact test probes directly contacts the lead extender, and wherein the semiconductor device testing apparatus is configured to apply a test current to the semiconductor package such that part of the test current flows through the first one of the contact test probes directly contacting the first one of the leads and such that part of the test current flows through the second one of the contact test probes directly contacting the lead extender.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A and 1B, illustrates a semiconductor package according to an embodiment. FIG. 1A illustrates the semiconductor package from a plan-view perspective; and FIG. 1B illustrates the semiconductor package from a side-view perspective.

FIGS. 2A, 2B, and 2C, illustrates a semiconductor device testing apparatus, according to an embodiment. FIG. 2A illustrates the semiconductor device testing apparatus from one isometric perspective; FIG. 2B illustrates the semiconductor device testing apparatus from another isometric perspective; and FIG. 2C illustrates the semiconductor device testing apparatus from a side-view perspective.

FIGS. 3A and 3B, illustrates a semiconductor package according to an embodiment. FIG. 3A illustrates the semiconductor package from a plan-view perspective; and FIG. 3B illustrates the semiconductor package from a side-view perspective.

FIGS. 5A and 5B, illustrates close-up views of a lead extender within a semiconductor device testing apparatus, according to an embodiment. FIG. 5A illustrates the semiconductor device testing apparatus before the contact test probe contacts the lead extender; and FIG. 5B illustrates semiconductor device testing apparatus after the contact test probe contacts the lead extender.

FIGS. 6A and 6B, illustrates close-up views of a lead extender within a semiconductor device testing apparatus, according to an embodiment. FIG. 6A illustrates a side-view of the lead extender; and FIG. 6B illustrates an isometric view of the lead extender, according to an embodiment.

DETAILED DESCRIPTION

A method of testing a semiconductor device and a corresponding semiconductor device testing apparatus with enhanced current delivery capacity are disclosed herein. The enhanced current delivery capacity is facilitated by a testing connection scheme whereby a package lead from a device under test is directly contacted at one side by one or more contact test probes and is directly contacted at a second opposite facing side by an electrically conductive lead extender, which in turn is directly contacted by one or more additional contact test probes. This testing connection scheme uses the lead extenders to increase the effective area that can be contacted by the contact test probes. This in turn decreases the magnitude of the current flowing through each of the contact test probes, thereby reducing the risk of damage to the contact test probes, e.g., due to burn out. Different types of semiconductor packages may be tested by the above-described testing connection scheme. Examples of semiconductor device testing apparatuses and lead extender configurations that may be used to test these different semiconductor package types are disclosed herein. In embodiments, the lead extender is configured as a contact mechanism that moves in response to contact with the contact test probes. This contact mechanism ensures reliable electrical contact and accommodates differences in the shape and position of the package leads.

Figure 1:
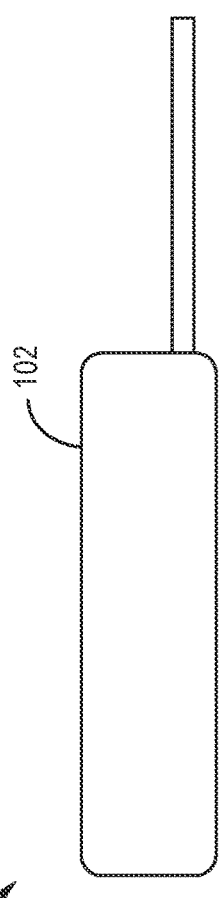
FIG. 1, which includes
Figure 1:
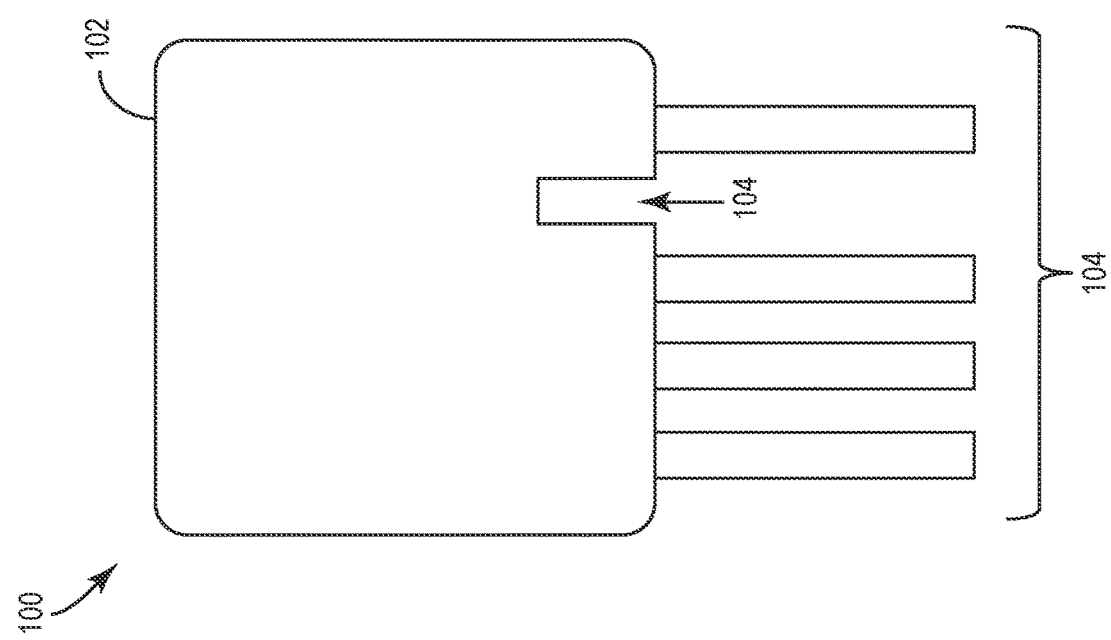

Referring to FIG. 1, a semiconductor package 100 is depicted, according to an embodiment. The semiconductor package 100 comprises an encapsulant body 102 and a plurality of leads 104 that protrude out from the encapsulant body 102. The encapsulant body 102 is formed from an electrically insulating material such as mold compound, epoxy, thermosetting plastic, polymer, etc. One or more semiconductor dies (not shown) are encapsulated by the encapsulant body 102. According to an embodiment, the semiconductor package 100 comprises a semiconductor die that is configured as a power switching device, e.g., a MOSFET, IGBT or HEMT. The semiconductor dies may be mounted on a die pad (not) shown, which may be part of the same lead frame structure as each of the leads 104. This lead frame structure may be formed from an electrically conductive material, e.g., copper (Cu), Aluminum (Al), Nickel (Ni), nickel phosphorous (NiP), silver (Ag), palladium (Pd), gold (Au), etc., alloys or combinations thereof. The semiconductor package 100 may comprise an electrical interconnect structure within the encapsulant body 102 that connects the semiconductor dies with one or more of the leads. This electrical interconnect may be a structure that is configured for high current carrying capacity, e.g., a metal clip, ribbon or dedicated lead frame section.

The semiconductor package 100 of FIG. 1 is configured as a straight lead package. In this package configuration, the leads 104 are planar and do not bend. Examples of straight lead packages include so-called transistor outline (TO) packages. According to an embodiment, the semiconductor package 100 is configured as a discrete power transistor package. In this package configuration, the pair of leads 104 that are separated from one another by the notch 106 in the encapsulant body 102 may correspond to the load terminals of the device. For example, this pair of leads 104 may correspond to the source and drain terminals in the case of a MOSFET (or vice-versa), or the emitter and collector terminals in the case of an IGBT (or vice-versa). The other leads 104 may correspond to a gate lead and a sense lead for sensing a load current. In other embodiments, the sense lead may be omitted.

Referring to FIGS. 2A and 2B, the semiconductor package 100 of FIG. 1 is tested using a semiconductor device testing apparatus 200. The semiconductor device testing apparatus 200 comprises a package holder 202 that is configured to receive one the semiconductor packages 100 and securely retain it during a device test. The package holder 202 may be formed from an electrically insulating material, such as an electrically insulating polymer material. The package holder 202 comprises a device sitting nest 204 that is dimensioned to accommodate the encapsulant body 102 of the semiconductor packages 100. The package holder 202 additionally comprises a lead backer 206 that is opposite from the leads 104 during the device test.

Figure 2:
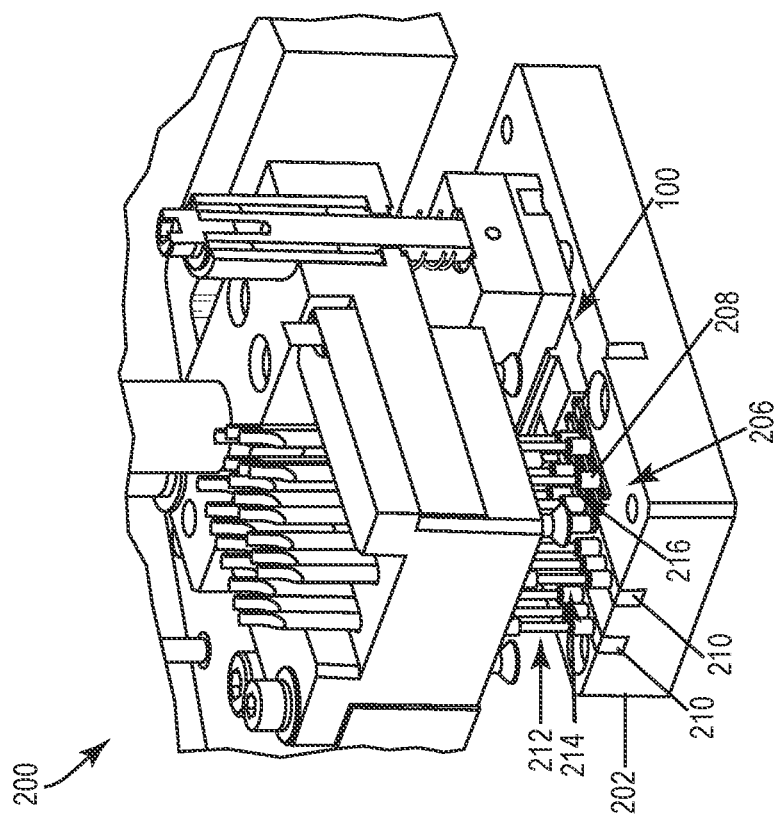
FIG. 2, which includes
Figure 2:
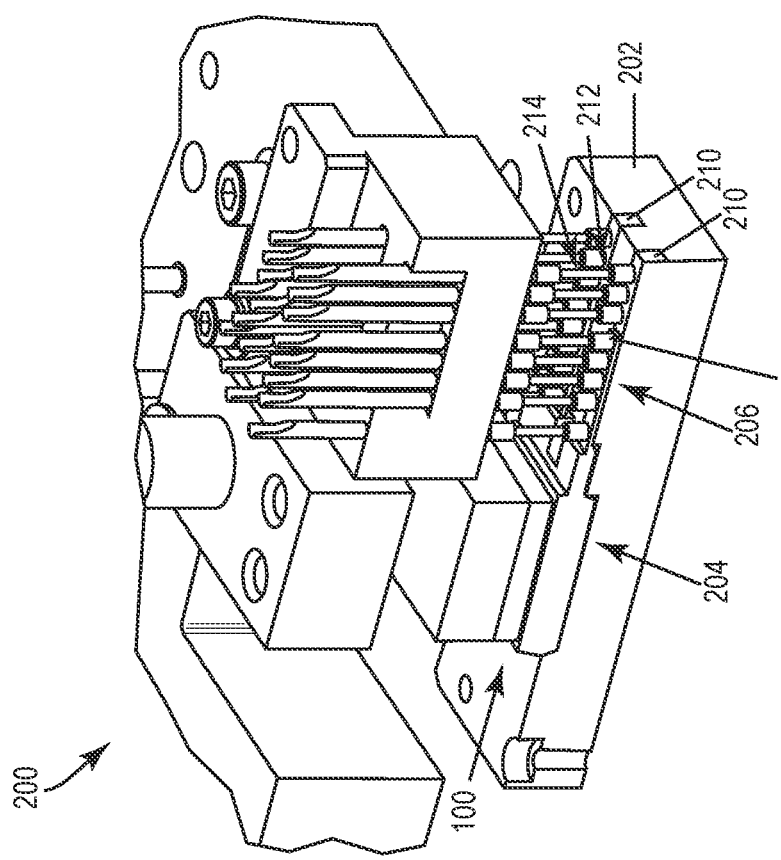

The semiconductor device testing apparatus 200 comprises a plurality of contact test probes 208. The contact test probes 208 are electrically conductive structures, e.g., structures comprising copper, aluminium, alloys thereof, that are designed to conduct a test current via contact at outer ends of the contact test probes 208. The semiconductor device testing apparatus 200 is configured to actuate (move) such that the contact test probes 208 are in contact with a test surface. This actuation may be done by moving the contact test probes 208 towards the semiconductor package 100, moving the semiconductor package 100 towards the contact test probes 208, or both. FIG. 2 shows the semiconductor device testing apparatus 200 after actuation is complete and the semiconductor package 100 is ready to be tested. The semiconductor device testing apparatus 200 may be designed to apply moderate force with the contact test probes 208, e.g., on the order of 1-5 N (newtons).

The semiconductor device testing apparatus 200 comprises one or more lead extenders 210. The lead extenders 210 are electrically conductive structures, e.g., structures formed from an electrically conductive metal, e.g., copper, aluminium, and alloys thereof. Each of the lead extenders 210 directly contacts one of the leads 104 from the semiconductor package 100. Furthermore, each of the lead extenders 210 is directly contacted by the contact test probes 208. In the depicted embodiment, the semiconductor device testing apparatus 200 comprises a first plurality 212 of the contact test probes 208, a second plurality 214 of the contact test probes 208, and a third plurality 216 of the contact test probes 208. The first plurality 212 of the contact test probes 208 is in direct contact with a first one of the leads 104 and one of the lead extenders 210, and the second plurality 214 of the contact test probes 208 is in direct contact with a second one of the leads 104 and one of the lead extenders 210, and the third plurality 216 of the contact test probes 208 is in direct contact with a third one of the leads 104.

Figures 2, 2C:
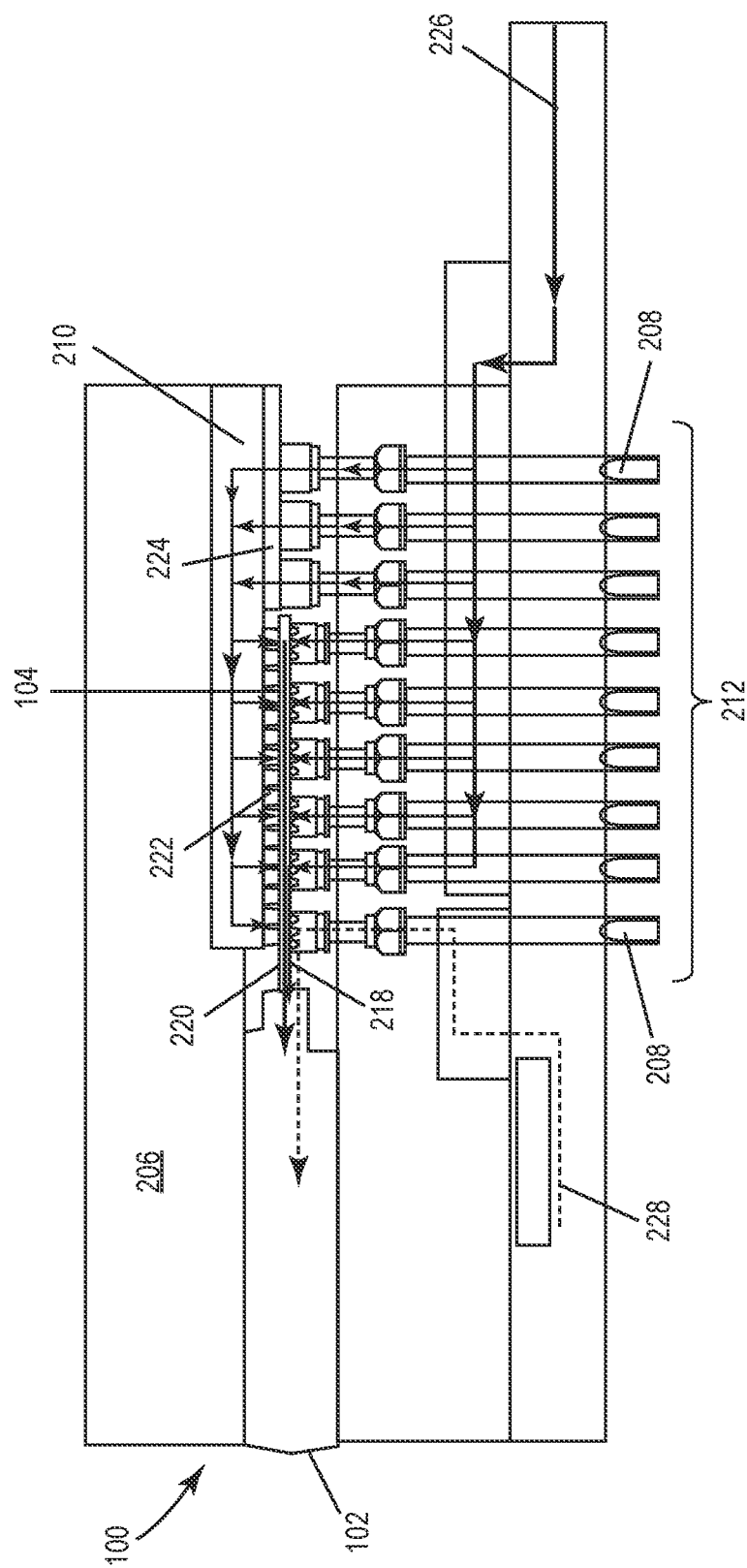

Referring to FIG. 2C, a close-up view of the connections of the first plurality 212 of the contact test probes 208 with the first one of the leads 104 is shown. The connections of the second plurality 214 of the contact test probes 208 with one of the leads 104 and one of the lead extenders 210 may be the same as the connections shown in FIG. 2C and described below.

After the actuation of the semiconductor device testing apparatus 200, some of the contact test probes 208 from the first plurality 212 of the contact test probes 208 directly contact the lead 104 and such that some of the contact test probes 208 from the first plurality 212 directly contact the lead extender 210. As shown, the first plurality 212 of the contact test probes 208 comprises nine of the contact test probes 208, with six of the contact test probes 208 directly contacting the lead 104 and three of the contact test probes 208 directly contacting the lead extender 210. More generally, the number of contact test probes 208 directly contacting the lead 104 and/or lead extender 210 may vary. In principle, the connection scheme disclosed herein can be implemented in any apparatus wherein at least one contact test probe 108 directly contacts a lead 104 and at least one contact test probe 108 directly contacts the corresponding lead extender 210 connected thereto.

The connection scheme advantageously utilizes both sides of the lead 104 to effectuate electrical contact. In more detail, multiple ones of the contact test probes 208 from the first plurality 212 directly contact a first side 218 of the lead 104. The lead extender 210 directly contacts a second side 220 of the lead 104 that is opposite from the first side 218 of the lead 104. This direct contact may occur after placement of the semiconductor package 100 within the package holder 202. Alternatively, the force applied by the contact test probes 208 may create the contact between the lead 104 and the lead extender 210.

In the depicted embodiment, the lead extender 210 is a continuous structure comprising a first contact surface 222 and a second contact surface 224. The first contact surface 222 faces and directly contacts the second side 220 of the lead 104. According to an embodiment, the first contact surface 222 is a roughened surface. That is, the first contact surface 222 is intentionally made non-planar. This roughened surface increases contact pressure between the lead extender 210 and the lead 104, thereby creating a reliable and secure electrical connection. The roughened surface may follow a regular pattern or may be random. The second contact surface 224 is disposed outside of the lateral footprint of the lead 104, thereby making this surface available for connection with the contact test probes 208. In the depicted embodiment, the lead extender 210 as a linear geometry such that the second contact surface 224 is disposed beyond a distal end of the lead 104, e.g., as shown in FIGS. 2A and 2B. Alternatively, the electrically conductive lead extender can be configured such that the second contact surface 224 is disposed in other locations. For example, the lead extender 210 may be arranged to extend perpendicularly to the edge sides of the lead 104 such that the second contact surface 224 is disposed outside of a lateral side of the lead 104. The second contact surface 224 may be offset from the first contact surface 222 and may be a roughened surface or may be a planar surface.

The semiconductor device testing apparatus 200 performs a test of the semiconductor package 100 in the following way. After the semiconductor package 100 is arranged within the package holder 202 and the semiconductor device testing apparatus 200 is actuated to effectuate the contact between the contact test probes 208 and the package leads 104 in the manner described above, a test current 226 is applied to the semiconductor package 100. The test current 226 flows through a conduction path of the semiconductor package 100. For example, the third plurality 216 of the contact test probes 208 that contacts the third one of the leads 104 may apply a gate signal to turn the device on, and the test current 226 may be flowed through a pair of the leads 104 corresponding to the load terminals of the device, e.g., source and drain, emitter and collector, etc. The magnitude of the test current 226 may be 100 A (amperes), 250 A, 500 A, 1 kA, 2 kA, 2 kA, or more. The test current 226 may be applied for a duration of 1 μSec (microsecond), 2 μSec, 3 μSec, or more. Due to the connection scheme, part of the test current 226 flows through some of the contact test probes 208 from the first plurality 212 directly contacting the lead 104 and part of the test current 226 flows through some of the contact test probes 208 from the first plurality 212 directly contacting the lead extender 210. Correspondingly, part of the test current 226 flows out from the lead 104 directly contacting the some of the contact test probes 208 from the second plurality 214 and part of the test current 226 flows out from the lead extender 210 directly contacting some of the contact test probes 208 from the second plurality 214. The lead extenders 210 advantageously allow for a decrease in the magnitude of the current that flows through each contact test probe 208. That is, the lead extenders 210 facilitate increased parallelization of the test current 226 whereby the current density in each contact test probe 208 is lower for a given test current 226. This increases the overall magnitude of the test current 226 that can be applied to the semiconductor package 100 without risking damage to the contact test probes 208 and/or the leads 104.

According to an embodiment, one of the contact test probes 208 may be configured to conduct a sense current 228. The sense current 228 may have a lower magnitude than the test current 226 that flows through the other ones of the contact test probes 208, e.g., $\frac{1}{10}^{th}$ of the current, $\frac{1}{20}^{th}$ of the current, etc. The remaining ones of the contact test probes 208 may conduct current of the substantially the same magnitude corresponding to a proportion of the overall test current 226.

Figure 3:
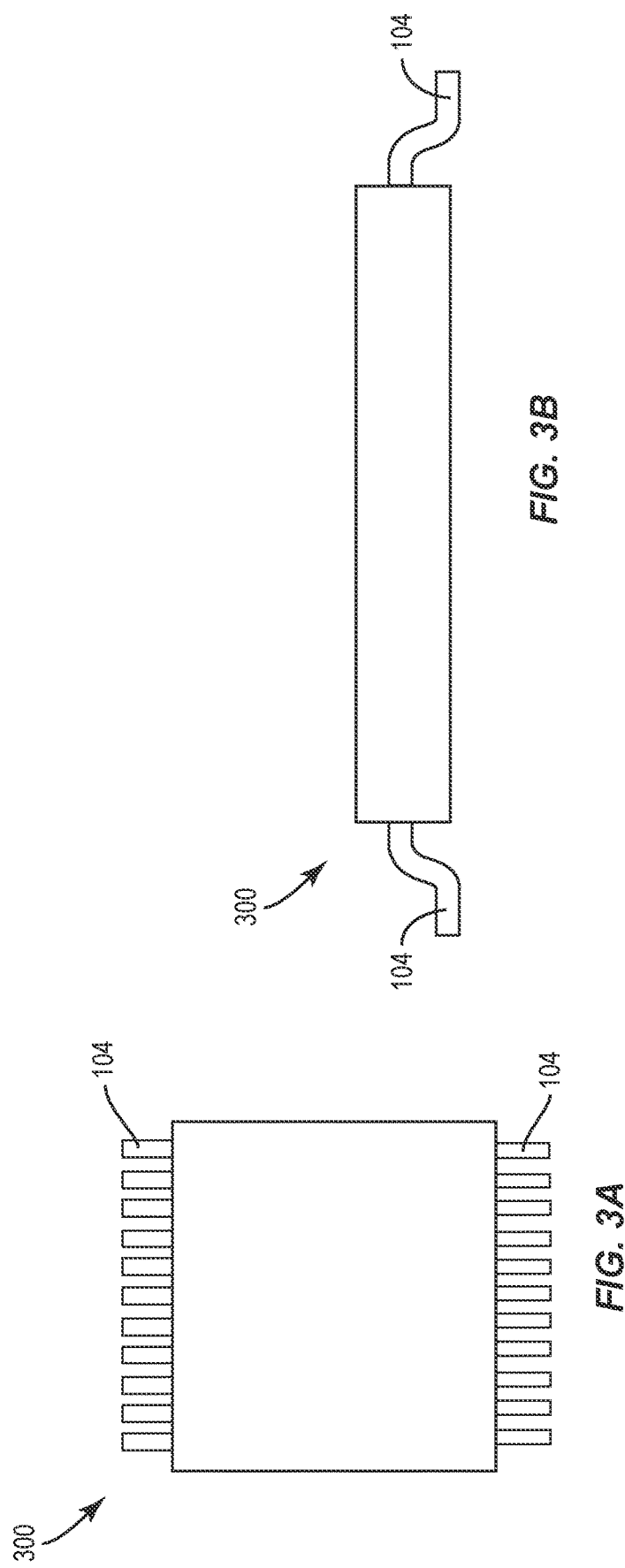
FIG. 3, which includes

Referring to FIG. 3, a semiconductor package 300 is depicted, according to another embodiment. Similar to the previous embodiment, the semiconductor package 300 comprises an encapsulant body 102 that encapsulates one or more semiconductor dies (not shown) and a plurality of leads 104 that protrude out from the encapsulant body 102. The semiconductor package 300 of FIG. 3 is configured as an SMD (surface mount device). An SMD refers to a device that is configured to be mounted on a carrier structure, such as a PCB, with the electrical contacts of the device (in this case the leads 104) facing and electrically connected to corresponding bond pads on the carrier structure. To this end, the leads 104 of the semiconductor package 300 are bent in such a way that the contacting surfaces of the leads 104 are substantially coplanar with a mounting side of the encapsulant body 102. The semiconductor package 300 of FIG. 3 may be configured as an IPM (intelligent power module), which refers to a semiconductor package 300 that comprises power devices and associated logic devices that control the power devices. For example, the semiconductor package 300 may comprise a pair or power transistor dies that form a half-bridge circuit and a driver die that is configured to control the switching of the high-side switch and the low-side switch from the half-bridge circuit.

Figure 4:
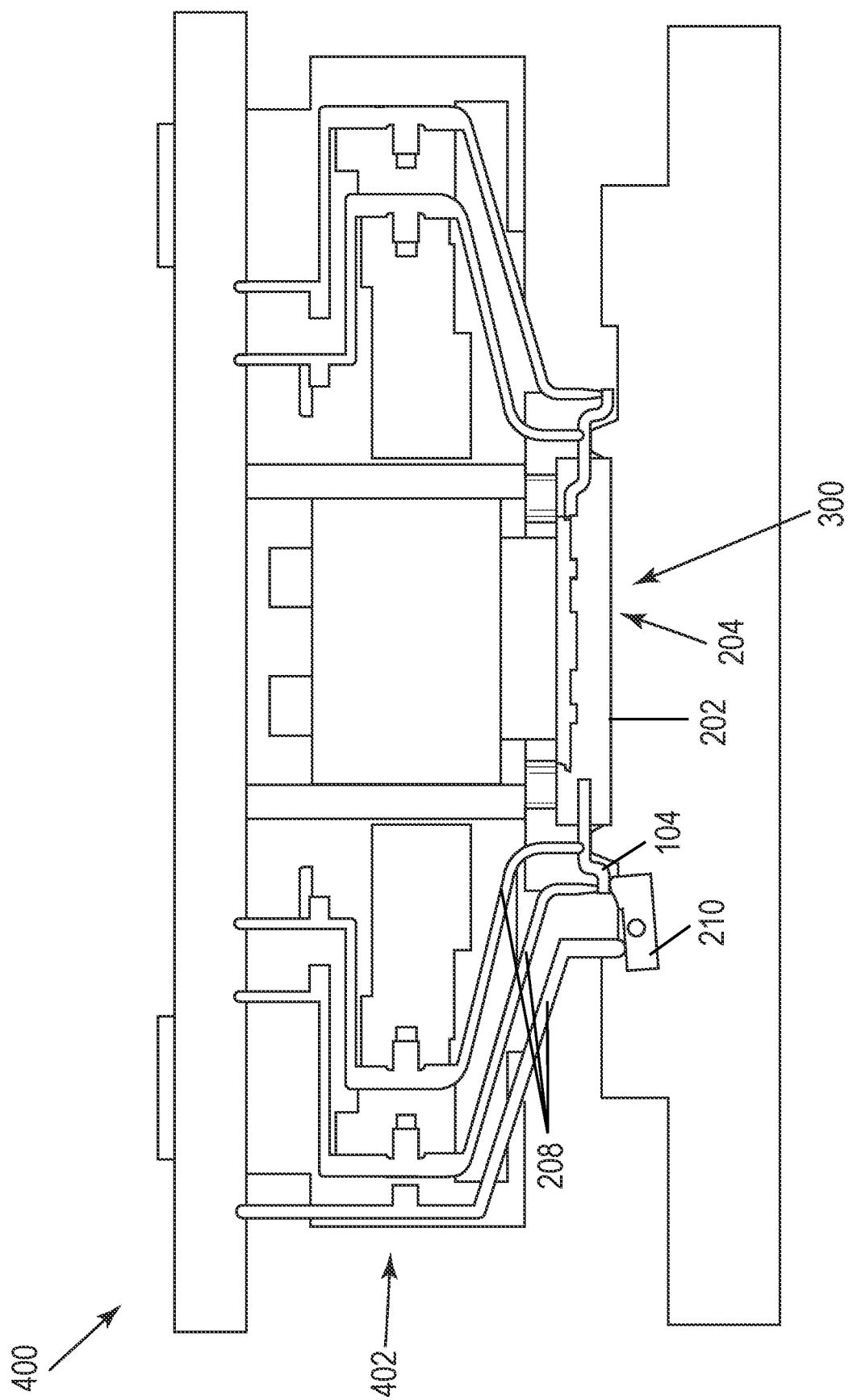
FIG. 4 illustrates a semiconductor device testing apparatus, according to an embodiment.

Referring to FIG. 4, the semiconductor package 300 of FIG. 3 is tested using a semiconductor device testing apparatus 400. While being different in its construction and adapted for a different package type, the semiconductor device testing apparatus 400 contains similarly denoted elements that perform similar functions as the semiconductor device testing apparatus 200 described with reference to FIG. 2. In more detail, the semiconductor device testing apparatus 400 comprises a package holder 202. The package holder 202 comprises a device sitting nest 204 that is dimensioned to receive the encapsulant body 102 of the semiconductor package 300. The package holder 202 additionally comprises an outer platform region 228 that is disposed outside of the device sitting nest 204. As shown, the outer platform region 228 is recessed from the device sitting nest 204. The semiconductor device is arranged in the device sitting nest 204 with the leads 104 extending over a bulkhead of the device sitting nest 204 and bending downward towards the outer platform region 228. The lead extender 210 is arranged within the outer platform region 228. While having some differences as lead extender 210 described with reference to FIG. 2, the details of which will be described below, the lead extender 210 in the semiconductor device testing apparatus 400 is an electrically conductive structure that is configured to provide additional contact area for additional contact test probes 208 in the same manner as described above.

The semiconductor device testing apparatus 400 of FIG. 4 comprises an actuating upper member 402 that can be actuated towards the semiconductor package 300 after the semiconductor package 300 is arranged within the package holder 202. In this embodiment, the actuating upper member 402 comprises three of the contact test probes 208 for each one of the leads 104. As shown, each of these contact test probes 208 may be configured as a cantilever arm that is independently affixed to a circuit board portion of the semiconductor device testing apparatus 400. The actuating upper member 402 is configured to move towards the semiconductor package 300 such that two of the contact test probes 208 directly contact one of the leads 104. The third one of the contact test probes 208 directly contacts the lead extender 210, which in turn directly contacts of the lead 104 according to the two-sided connection scheme as described above. The direct contact between the lead extender 210 and the lead 104 may occur when the semiconductor package 300 is arranged within the package or may occur after the contact test probes 208 are actuated. After the actuation, the semiconductor device testing apparatus 400 may perform a test of the semiconductor package 300 whereby a test current 226 is applied to the lead 104 such that part of the test current 226 flows through the contact test probes 208 directly contacting the lead 104 and such that part of the test current 226 flows through the contact test probes 208 directly contacting the lead extender 210 in a similar manner as described above. According to an embodiment, one of the two contact test probes 208 that directly contacts the lead 104 provides a sense current 228, whereas the test current 226 is applied in substantially equal proportion between the other contact test probe 208 that directly contacts the lead 104 and the contact test probe 208 that contacts the lead extender 210. The semiconductor device testing apparatus 400 may comprise one of the lead extenders 210 and corresponding contact test probes 208 configured to contact this lead extender 210 for any one of the package leads 104 from the semiconductor package 300 such that an electrical test may be performed between any current path of the semiconductor package 300.

Referring to FIGS. 5A and 5B, close-up view of the semiconductor device testing apparatus 400 at the connection interface between the contact test probe 208 and the lead extender 210 is shown. FIG. 5A shows the semiconductor device testing apparatus 400 before or during actuation. FIG. 5B shows the testing apparatus after actuation with one of the contact test probes 208 directly contacting the lead extender 210 and two of the contact test probes 208 directly contacting the lead 104. According to this embodiment, the lead extender 210 is configured as contact mechanism that moves in response to the direct contact from the contact test probe 208. The movement of the contact mechanism ensures a reliable electrical connection so that the semiconductor device testing apparatus 400 may perform the current test. One challenge in semiconductor package testing is ensuring reliable contact with the leads 104 of a semiconductor package. This problem may be particularly pronounced in package designs with high-lead counts and/or packages with bent leads 104 such as the SMD type semiconductor package 300 disclosed herein, wherein there may be minor variations in the package such that the contact location for each lead 104 may be slightly unpredictable. The contact mechanism addresses this issue by providing a margin for movement of the contact test probes 208 after initial contact. This margin for movement can accommodate significant differences in lead geometry. Moreover, in some cases, the movement of the contact mechanism can be used to ensure and/or enhance the connection between the lead extender 210 and the lead 104, thereby facilitating a reliable test connection.

Figure 5:
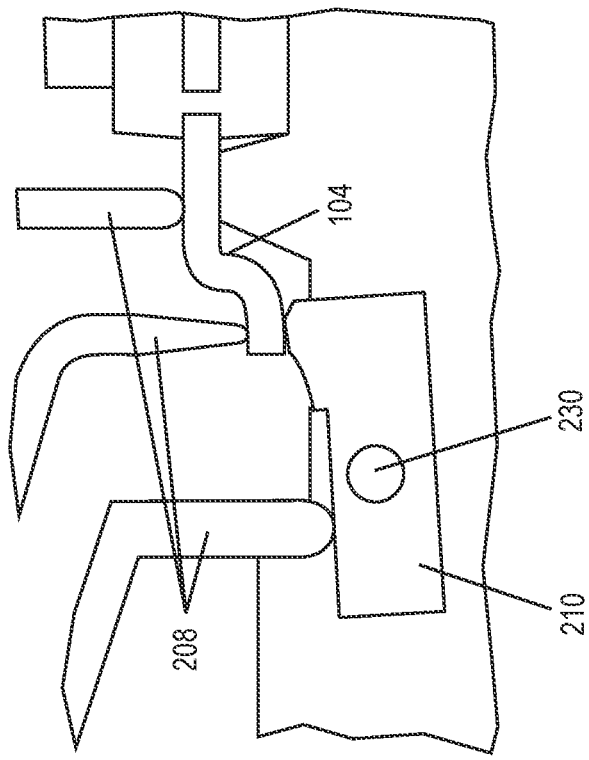
FIG. 5, which includes
Figure 5:
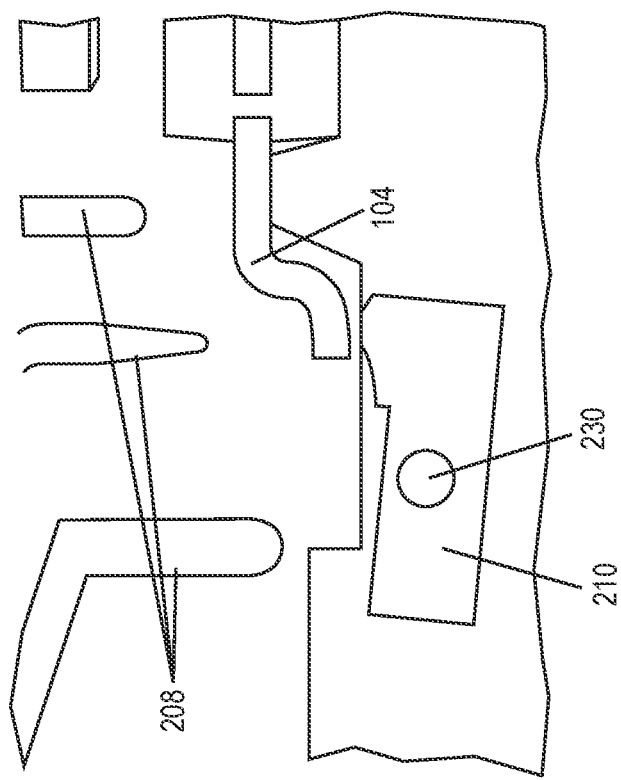

In the embodiment of FIG. 5 the contact mechanism is a pivoting contact block that is configured to pivot about a fulcrum 230 in response to contact with one of the contact test probes 208. The pivoting contact block may be formed of an electrically conductive metal, e.g., copper, aluminium, alloys thereof and arranged within a recess that permits a range of motion. As the contact test probe 208 contacts one side of the pivoting contact block and the actuating upper member 402 continues to move downward, the pivoting contact block pivots about the fulcrum 230 such that the contact test probe 208 continues to move downward and such that an opposite side of the pivoting contact block moves upward. This allows for movement the contact test probe 208 and ensures a reliable connection between the electrically lead extender 210 and the lead 104 by providing a counteracting force.

Figure 6:
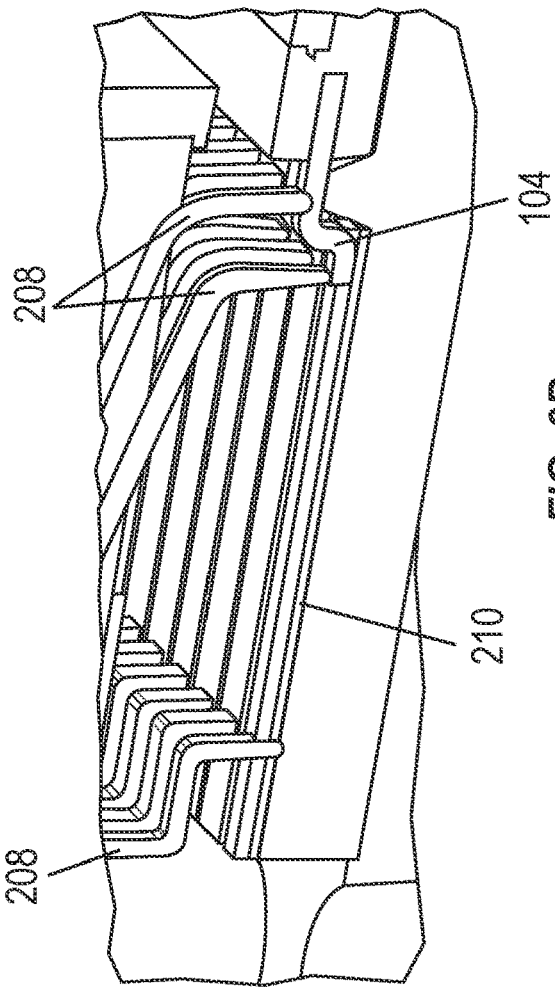
FIG. 6, which includes
Figure 6:
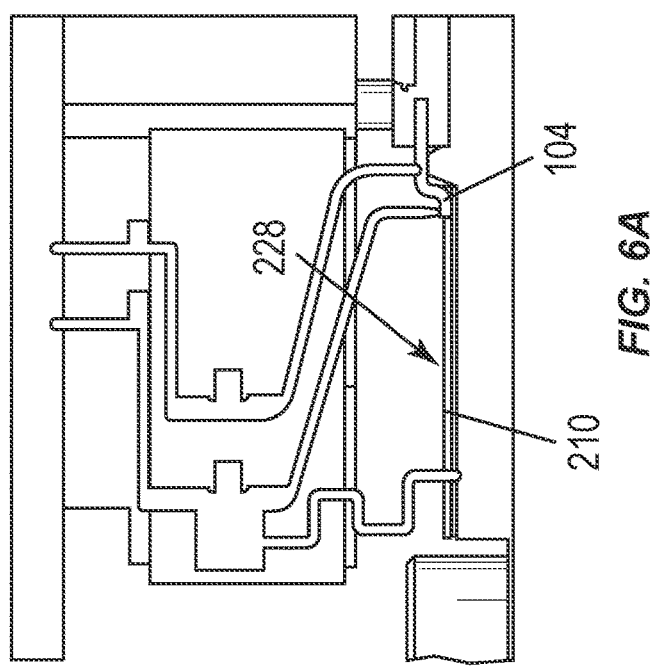

Referring to FIGS. 6A and 6B, a lead extender 210 that is configured as a contact mechanism is shown, according to another embodiment. In this embodiment, the contact mechanism is a conductive pad that is disposed in the outer platform region 228, of the semiconductor device testing apparatus 400. This conductive pad is configured to elastically deform in response to contact with one of the contact test probes 208. As the semiconductor device testing apparatus 400 moves the contact test probe 208 downward, the elastic pad permits some deflection and increases the compression force, thereby ensuring a reliable electrical connection. Similarly, the contact test probes 208 that contact the lead 104 apply a downward force that moves the lead 104 downward and ensures a reliable electrical connection.

Figure 7:
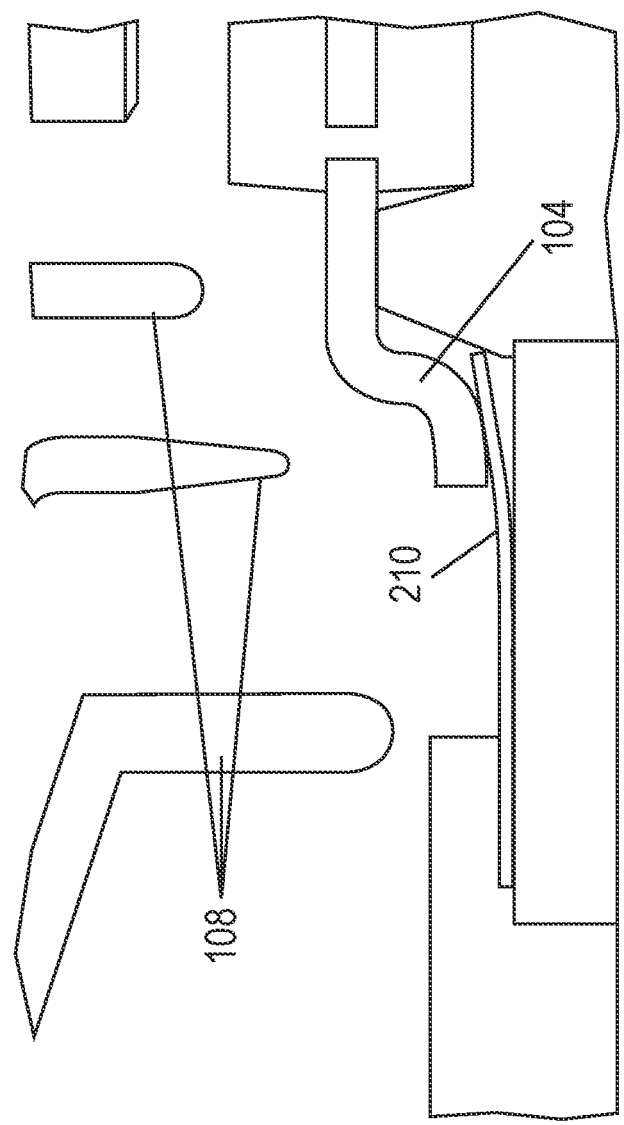
FIG. 7 illustrates a close-up view of a lead extender within a semiconductor device testing apparatus, according to an embodiment.

Referring to FIG. 7, a lead extender 210 that is configured as a contact mechanism is shown, according to another embodiment. In this embodiment, the contact mechanism is a curved blade that is affixed at one end and is configured to elastically deform in response to contact with one of the leads 104. In this configuration, the contact mechanism responds to downward force applied by the lead 104 resulting from the contact test probes 208 contacting the lead 104 in a spring like manner, thereby ensuring a reliable electrical contact with the lead extender 210 and permitting a range of motion to account for variations in lead position. The curved blade can be formed of a metal, such as copper, aluminium, etc.

The semiconductor die or dies incorporated into the semiconductor packages disclosed herein may have different device configurations. These device configurations include lateral devices that are configured to control a current flowing parallel to a main surface of the die and vertical devices that are configured to control current flowing between a main surface and an opposite facing rear surface of the semiconductor die. Moreover, the die or dies of the semiconductor package may be formed in many different material technologies. For example, the one or more semiconductor dies of the semiconductor package may comprise semiconductor material from group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe).

Although the present disclosure is not so limited, the following numbered examples demonstrate one or more aspects of the disclosure.

Example 1. A method of testing a semiconductor device, the method comprising: providing a semiconductor package comprising an encapsulant body, and a plurality of leads that protrude out from the encapsulant body; providing a semiconductor device testing apparatus comprising a package holder, a plurality of contact test probes, and a lead extender; arranging the semiconductor package within the package holder; actuating the semiconductor device testing apparatus such that a first one of the contact test probes directly contacts a first one of the leads and such that a second one of the contact test probes directly contacts the lead extender; and applying a test current to the semiconductor package such that part of the test current flows through the first one of the contact test probes directly contacting the first one of the leads and such that part of the test current flows through the second one of the contact test probes directly contacting the lead extender.

Example 2. The method of example 1, wherein after actuating the semiconductor device testing apparatus: the first one of the contact test probes directly contacts the first one of the leads at a first side; the lead extender directly contacts the first one of the leads at a second side that is opposite from the first side; and the second one of the contact test probes directly contacts the lead extender.

Example 3. The method of example 2, wherein after actuating the semiconductor device testing apparatus two or more of the contact test probes directly contact the first one of the leads at the first side.

Example 4. The method of example 3, wherein one of the contact test probes that directly contacts the first one of the leads at the first side applies a sense current.

Example 5. The method of example 2, wherein the semiconductor device testing apparatus comprises a first plurality of contact test probes, and wherein after actuating the semiconductor device testing apparatus multiple ones of the contact test probes contact test probes from the first plurality directly contact the first one of the leads and multiple ones of the contact test probes contact test probes from the first plurality directly contact the lead extender.

Example 6. The method of example 1, wherein the semiconductor device testing apparatus comprising further comprises a second lead extender, wherein the semiconductor device testing apparatus is actuated such that a third one of the contact test probes directly contacts a second one of the leads and such that a fourth one of the contact test probes directly contacts the second lead extender.

Example 7. The method of example 1, wherein the test current is at least 250 A.

Example 8. The method of example 1, wherein the semiconductor package is configured as a straight lead package.

Example 9. The method of example 1, wherein the semiconductor package is configured as a surface mount package.

Example 10. The method of example 9, wherein the electrically conductive lead extender is configured as a dynamic contact mechanism that moves in response to direct contact between the second one of the contact test probes and the first one of the leads extender.

Example 11. A semiconductor device testing apparatus, comprising: a package holder; a plurality of contact test probes; and a lead extender; wherein the semiconductor device testing apparatus is configured to actuate with a semiconductor package arranged within the package holder such that a first one of the contact test probes directly contacts a first one of the leads and such that a second one of the contact test probes directly contacts the lead extender; and wherein the semiconductor device testing apparatus is configured to apply a test current to the semiconductor package such that part of the test current flows through the first one of the contact test probes directly contacting the first one of the leads and such that part of the test current flows through the second one of the contact test probes directly contacting the lead extender.

Example 12. The semiconductor device testing apparatus of example 11, wherein the semiconductor device testing apparatus is configured such that after the actuating the first one of the contact test probes directly contacts the first one of the leads at a first side, the lead extender directly contacts the first one of the leads at a second side that is opposite from the first side; and the second one of the contact test probes directly contacts the lead extender.

Example 13. The semiconductor device testing apparatus of example 12, wherein the package holder is configured to accommodate a straight lead package, and wherein the electrically conductive lead extender is disposed on an electrically insulating lead backer portion of the package holder.

Example 14. The semiconductor device testing apparatus of example 13, wherein the electrically conductive lead extender is a continuous metal structure comprising a first contact surface and a second contact surface, wherein the semiconductor device testing apparatus is configured such that the first one of the leads contacts the first contact surface of the electrically conductive lead extender and such that the second one of the contact test probes directly contacts the second contact surface after the actuating.

Example 15. The semiconductor device testing apparatus of example 14, wherein the first contact surface is a roughened surface.

Example 16. The semiconductor device testing apparatus of example 12, wherein the package holder is configured to accommodate a surface mount device package, wherein the package holder comprises a device sitting nest and an outer platform region that is disposed outside of the device sitting nest, and wherein the leads extender is arranged within the outer platform region.

Example 17. The semiconductor device testing apparatus of example 15, wherein the electrically conductive lead extender comprises a contact mechanism that is configured to move in response to the direct contact between the second contact test probe and the electrically conductive lead extender.

Example 18. The semiconductor device testing apparatus of example 17, wherein the contact mechanism is a conductive pad that is disposed in the outer platform region, wherein the conductive pad is configured to elastically deform in response to contact with the second one of the contact test probes.

Example 19. The semiconductor device testing apparatus of example 17, wherein the contact mechanism is a pivoting contact block that is configured to pivot about a fulcrum in response to contact with the second one of the contact test probes.

Example 20. The semiconductor device testing apparatus of example 19, wherein the contact mechanism is a curved blade that is affixed at one end and is configured to elastically deform in response to contact with one of the leads.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of testing a semiconductor device, the method comprising:
   providing a semiconductor package comprising an encapsulant body and a plurality of leads that protrude out from the encapsulant body;
   providing a semiconductor device testing apparatus comprising a package holder, a plurality of contact test probes, and a lead extender;
   arranging the semiconductor package within the package holder;
   actuating the semiconductor device testing apparatus such that a first one of the contact test probes directly contacts a first one of the leads and such that a second one of the contact test probes directly contacts the lead extender; and
   applying a test current to the semiconductor package such that part of the test current flows through the first one of the contact test probes directly contacting the first one of the leads and such that part of the test current flows through the second one of the contact test probes directly contacting the lead extender.

2. The method of claim 1, wherein after actuating the semiconductor device testing apparatus:
   the first one of the contact test probes directly contacts the first one of the leads at a first side;
   the lead extender directly contacts the first one of the leads at a second side that is opposite from the first side; and
   the second one of the contact test probes directly contacts the lead extender.

3. The method of claim 2, wherein after actuating the semiconductor device testing apparatus two or more of the contact test probes directly contact the first one of the leads at the first side.

4. The method of claim 3, wherein one of the contact test probes that directly contacts the first one of the leads at the first side applies a sense current.

5. The method of claim 2, wherein the semiconductor device testing apparatus comprises a first plurality of contact test probes, and wherein after actuating the semiconductor device testing apparatus multiple ones of the contact test probes from the first plurality directly contact the first one of the leads and multiple ones of the contact test probes contact test probes from the first plurality directly contact the lead extender.

6. The method of claim 1, wherein the semiconductor device testing apparatus comprising further comprises a second lead extender, wherein the semiconductor device testing apparatus is actuated such that a third one of the contact test probes directly contacts a second one of the leads and such that a fourth one of the contact test probes directly contacts the second lead extender.

7. The method of claim 1, wherein the test current is at least 250 A.

8. The method of claim 1, wherein the semiconductor package is configured as a straight lead package.

9. The method of claim 1, wherein the semiconductor package is configured as a surface mount package.

10. The method of claim 9, wherein the electrically conductive lead extender is configured as a dynamic contact mechanism that moves in response to direct contact between the second one of the contact test probes and the first one of the leads extender.

11. A semiconductor device testing apparatus, comprising:
    a package holder;
    a plurality of contact test probes; and
    a lead extender;
    wherein the semiconductor device testing apparatus is configured to actuate with a semiconductor package comprising a plurality of leads, wherein the semiconductor package is arranged within the package holder such that a first one of the contact test probes directly contacts a first one of the leads and such that a second one of the contact test probes directly contacts the lead extender; and
    wherein the semiconductor device testing apparatus is configured to apply a test current to the semiconductor package such that part of the test current flows through the first one of the contact test probes directly contacting the first one of the leads and such that part of the test current flows through the second one of the contact test probes directly contacting the lead extender.

12. The semiconductor device testing apparatus of claim 11, wherein the semiconductor device testing apparatus is configured such that after the actuating the first one of the contact test probes directly contacts the first one of the leads at a first side, the lead extender directly contacts the first one of the leads at a second side that is opposite from the first side; and
    the second one of the contact test probes directly contacts the lead extender.

13. The semiconductor device testing apparatus of claim 12, wherein the package holder is configured to accommodate a straight lead package, and wherein the electrically conductive lead extender is disposed on an electrically insulating lead backer portion of the package holder.

14. The semiconductor device testing apparatus of claim 13, wherein the electrically conductive lead extender is a continuous metal structure comprising a first contact surface and a second contact surface, wherein the semiconductor device testing apparatus is configured such that the first one of the leads contacts the first contact surface of the electrically conductive lead extender and such that the second one of the contact test probes directly contacts the second contact surface after the actuating.

15. The semiconductor device testing apparatus of claim 14, wherein the first contact surface is a roughened surface.

16. The semiconductor device testing apparatus of claim 12, wherein the package holder is configured to accommodate a surface mount device package, wherein the package holder comprises a device sitting nest and an outer platform region that is disposed outside of the device sitting nest, and wherein the leads extender is arranged within the outer platform region.

17. The semiconductor device testing apparatus of claim 16, wherein the electrically conductive lead extender comprises a contact mechanism that is configured to move in response to the direct contact between the second contact test probe and the electrically conductive lead extender.

18. The semiconductor device testing apparatus of claim 17, wherein the contact mechanism is a conductive pad that is disposed in the outer platform region, wherein the conductive pad is configured to elastically deform in response to contact with the second one of the contact test probes.

19. The semiconductor device testing apparatus of claim 17, wherein the contact mechanism is a pivoting contact block that is configured to pivot about a fulcrum in response to contact with the second one of the contact test probes.

20. The semiconductor device testing apparatus of claim 19, wherein the contact mechanism is a curved blade that is affixed at one end and is configured to elastically deform in response to contact with one of the leads.

* * * * *

UNITED STATES PATENT AND TRADEMARK OFFICE
CERTIFICATE OF CORRECTION

PATENT NO. : 12,270,850 B2
APPLICATION NO. : 18/119076
DATED : April 8, 2025
INVENTOR(S) : S. Kho et al.

Page 1 of 1

It is certified that error appears in the above-identified patent and that said Letters Patent is hereby corrected as shown below:

In the Claims

Column 11, Line 56 (Claim 6, Line 2) please change "apparatus comprising further" to -- apparatus further --

Signed and Sealed this
Fifteenth Day of July, 2025

Coke Morgan Stewart
*Acting Director of the United States Patent and Trademark Office*